(12) United States Patent
Inada et al.

(10) Patent No.: US 9,331,572 B2
(45) Date of Patent: May 3, 2016

(54) SEMICONDUCTOR DEVICE AND POWER CONVERSION DEVICE

(71) Applicant: PANASONIC CORPORATION, Osaka (JP)

(72) Inventors: Hiroshi Inada, Osaka (JP); Tatsuo Morita, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/500,043

(22) Filed: Sep. 29, 2014

(65) Prior Publication Data

US 2015/0014746 A1    Jan. 15, 2015

Related U.S. Application Data

(63) Continuation of application No. PCT/JP2013/000396, filed on Jan. 25, 2013.

(30) Foreign Application Priority Data

Apr. 26, 2012  (JP) .................................. 2012-101099

(51) Int. Cl.
*H01L 29/66*    (2006.01)
*H02M 3/156*    (2006.01)
(Continued)

(52) U.S. Cl.
CPC ............. *H02M 3/156* (2013.01); *H01L 25/072* (2013.01); *H01L 27/0605* (2013.01);
(Continued)

(58) Field of Classification Search
CPC ... H02M 3/156; H02M 7/003; H02M 3/1588; H02M 1/08; H02M 2001/0048; H01L 27/0605; H01L 29/7787; H01L 25/072; H01L 29/739; H01L 29/7786; H01L 29/41758; H01L 29/2003; H01L 29/41725; H01L 2924/0002; H01L 29/1066; H03K 17/01
See application file for complete search history.

(56) References Cited

U.S. PATENT DOCUMENTS 5,798,968 A  *  8/1998  Lee ........................ G11C 5/025
                                                  257/E27.103
9,012,920 B2 *  4/2015  Ju ........................ H01L 29/2003
                                                  257/76

(Continued)

FOREIGN PATENT DOCUMENTS

JP           60-249374 A     12/1985
JP         2000-311918 A     11/2000

(Continued)

OTHER PUBLICATIONS

International Search Report issued in PCT/JP2013/000396, dated Apr. 9, 2013, with English translation.

(Continued)

*Primary Examiner* — Jarrett Stark
(74) *Attorney, Agent, or Firm* — McDermott Will & Emery LLP

(57) ABSTRACT

A switching device includes a power semiconductor chip, and a drive circuit which drives the power semiconductor chip. In the power semiconductor chip, a path through which a main current flows is connected to a first source terminal, and a ground terminal of the drive circuit is connected to a second source terminal of the power semiconductor chip. As a result, a gate drive path is separated from the path through which the main current flows, and therefore, the influence of induced electromotive force which is generated due to source parasitic inductance, on a gate-source voltage, is reduced.

13 Claims, 16 Drawing Sheets

(51) Int. Cl.
*H01L 29/417* (2006.01)
*H01L 29/20* (2006.01)
*H01L 29/739* (2006.01)
*H01L 29/778* (2006.01)
*H01L 25/07* (2006.01)
*H01L 27/06* (2006.01)
*H03K 17/16* (2006.01)
*H01L 29/10* (2006.01)
*H02M 1/08* (2006.01)
*H02M 1/00* (2006.01)
*H02M 3/158* (2006.01)
*H02M 7/00* (2006.01)

(52) U.S. Cl.
CPC ..... *H01L 29/2003* (2013.01); *H01L 29/41725* (2013.01); *H01L 29/41758* (2013.01); *H01L 29/739* (2013.01); *H01L 29/7786* (2013.01); *H01L 29/7787* (2013.01); H01L 29/1066 (2013.01); H01L 2924/0002 (2013.01); H02M 1/08 (2013.01); H02M 3/1588 (2013.01); H02M 7/003 (2013.01); H02M 2001/0048 (2013.01); H03K 17/16 (2013.01); Y02B 70/1466 (2013.01); Y02B 70/1491 (2013.01)

(56) References Cited

U.S. PATENT DOCUMENTS

| | | | |
|---|---|---|---|
| 2004/0227547 | A1 | 11/2004 | Shiraishi et al. |
| 2008/0117691 | A1* | 5/2008 | Kawasaki ............. G11C 16/16 365/185.33 |
| 2010/0213503 | A1 | 8/2010 | Yanagihara et al. |
| 2015/0255547 | A1* | 9/2015 | Yuan ..................... H01L 29/861 257/76 |
| 2015/0293413 | A1* | 10/2015 | Aoyama ........... G02F 1/136286 349/43 |

FOREIGN PATENT DOCUMENTS

| | | |
|---|---|---|
| JP | 2004-342735 A | 12/2004 |
| JP | 2010-103158 A | 5/2010 |
| JP | 2013055188 | 3/2013 |

OTHER PUBLICATIONS

Japanese Office Action issued in Japanese Patent Application No. 2014512301, dated Dec. 15, 2015.

* cited by examiner

SEMICONDUCTOR DEVICE AND POWER CONVERSION DEVICE

CROSS-REFERENCE TO RELATED APPLICATIONS

This is a continuation of International Application No. PCT/JP2013/000396 filed on Jan. 25, 2013, which claims priority to Japanese Patent Application No. 2012-101099 filed on Apr. 26, 2012. The entire disclosures of these applications are incorporated by reference herein.

BACKGROUND

The present disclosure relates to semiconductor devices used as a switching element for a power supply circuit etc., and more particularly, to techniques which are effective in improving the efficiency of power conversion.

There has been a demand for an energy-saving power supply circuit. To meet the demand, it is required to reduce power loss to improve the efficiency of power conversion in a power conversion device, such as a DC-DC converter, an inverter, etc. In these devices, most of power loss occurs in a switching device, such as an insulated gate bipolar transistor (IGBT) or a metal-oxide-semiconductor field-effect transistor (MOSFET). Therefore, a reduction in power loss in the switching device would significantly contribute to an improvement in power conversion efficiency.

Power loss which occurs in a switching device includes conduction loss caused by passage of a current and switching loss caused by switching operation. Conduction loss can be reduced by decreasing the on-state resistance of the power semiconductor element, and switching loss can be reduced by increasing the switching speed of the power semiconductor element. Therefore, techniques have been developed for decreasing the on-state resistance of the power semiconductor element and increasing the switching speed of the power semiconductor element.

On the other hand, the power semiconductor element which operates at an increasingly higher frequency has been developed in order to reduce the size of a power supply circuit. For a DC-DC converter for use in a power supply circuit for a personal computer, a stationary game machine, etc., there has been a trend toward increasing the current in order to drive the central processing unit at high speed.

A DC-DC converter includes a high-side switch and a low-side switch. Each switch includes a power semiconductor element. Power conversion is performed by alternately switching the high-side switch and the low-side switch on/off in synchronization with each other. The high-side switch serves as a control switch for the DC-DC converter, and the low-side switch serves as a switch for synchronous rectification.

For example, when the high-side switch and the low-side switch are provided in a single package, parasitic inductance occurs due to wire bonding or printed circuit board traces of the package. In particular, when a main current flows through the parasitic inductance at the source terminal of the high-side switch, great induced electromotive force is generated. Therefore, turn-on of the high-side switch is delayed, leading to a deterioration in power conversion efficiency. Therefore, as a technique of improving the power conversion efficiency of the DC-DC converter, it has been proposed that the influence of parasitic inductance which is caused due to wire bonding or packaging is reduced by separating a gate drive path from a main current path (see Japanese Unexamined Patent Publication No. 2004-342735).

However, the DC-DC converter as described above has the following problems. Specifically, the increase in frequency and current of the DC-DC converter causes a delay in turn-on switching due to induced electromotive force generated by the parasitic inductance of lead traces in a chip which connect between a source electrode and a source terminal or between a drain electrode and a drain terminal, which is not required to be taken into account in the conventional art.

FIG. 14 is a circuit diagram showing a configuration of a switching device 300A which is a conventional semiconductor device. The switching device 300A of FIG. 14 includes a power semiconductor chip 301A, a drive circuit 302 which drives the power semiconductor chip 301A, a control signal source 303, an input power supply 304, a logic power supply 305, and a load resistor 306. The power semiconductor chip 301A has a transistor having a gate electrode G, a drain electrode D, and a source electrode S, a gate terminal 200, a drain terminal 201, and a source terminal 202. In the power semiconductor chip 301A, there are gate parasitic inductance (Lg) 307A, drain parasitic inductance (Ld) 307B, and source parasitic inductance (Ls) 307C which are caused by the internal trace structure. A main current 204 flows between the drain terminal 201 and the source terminal 202.

FIG. 15 is an enlarged plan view showing an electrode layout of the power semiconductor chip 301A of FIG. 14. A semiconductor multilayer arrangement 101 is formed on a substrate 100, and drain electrodes 103 and source electrodes 104 are formed on the semiconductor multilayer arrangement 101 with a space between each electrode. Gate electrodes 102 are formed between the drain electrodes 103 and the source electrodes 104. Thus, the power semiconductor chip 301A has a horizontal device structure. The drain electrodes 103 are connected to a drain lead trace 105 through vias 11D. Similarly, the source electrodes 104 are connected to a source lead trace 106 through vias 11S. The drain lead trace 105 is connected to the drain terminal 201, and the source lead trace 106 is connected to the source terminal 202.

FIG. 16 is a plan view showing a layout of the power semiconductor chip 301A of FIG. 14 on a printed circuit board (not shown). The output of the drive circuit 302 is connected to the gate terminal 200 of the power semiconductor chip 301A through a printed circuit board trace 4G. The drain terminal 201 of the power semiconductor chip 301A is connected to a drain region 205 of the printed circuit board through a printed circuit board trace 4D. The source terminal 202 of the power semiconductor chip 301A is connected to a source region 206 of the printed circuit board through a printed circuit board trace 4S. A ground terminal of the drive circuit 302 is connected to the source terminal 202 of the power semiconductor chip 301A through a printed circuit board trace 4GR. The main current 204 flowing through the printed circuit board flows from the drain region 205 of the printed circuit board to the source region 206 of the printed circuit board through the drain and source terminals 201 and 202 of the power semiconductor chip 301A.

The drive circuit 302 is grounded at the source. Note that, for example, an interlayer insulating film (not shown) is provided so that the printed circuit board trace 4GR connecting the ground terminal of the drive circuit 302 and the source terminal 202 together is not in contact with the gate terminal 200 or the drain terminal 201.

FIG. 17 is a waveform diagram showing that a gate-source voltage Vgs and a source voltage Vs in the power semiconductor chip 301A of FIG. 14 are easily affected by the source parasitic inductance 307C. As shown in FIG. 17, particularly when the source parasitic inductance 307C increases, the source voltage Vs increases due to induced electromotive force generated by flow of the main current 204, so that the rise and fall of the gate-source voltage Vgs are delayed. As a result, turn-on loss and turn-off loss increase, leading to a significant deterioration in power conversion efficiency.

SUMMARY

The present disclosure describes implementations of a low-loss semiconductor device and power conversion device which can improve the efficiency of power conversion even when the internal lead trace of a power semiconductor chip has high parasitic inductance.

A semiconductor device according to an embodiment of the present disclosure includes a power semiconductor chip. The power semiconductor chip includes a substrate, a semiconductor multilayer arrangement formed on the substrate, a source electrode and a drain electrode formed on the semiconductor multilayer arrangement with a space between the source electrode and the drain electrode, a gate electrode formed between the source electrode and the drain electrode, a drain lead trace, a first source lead trace, and a second source lead trace, and a first terminal, a second terminal, a third terminal, and a fourth terminal. The gate electrode is connected to the first terminal. The drain electrode and the second terminal are connected together through the drain lead trace. The source electrode and the third terminal are connected together through the first source lead trace. The source electrode and the fourth terminal are connected together through the second source lead trace. The second terminal and the third terminal are configured to cause a main current to flow between the second terminal and the third terminal.

A power conversion device according to an embodiment of the present disclosure includes a power semiconductor chip having a half-bridge configuration including a high-side switch and a low-side switch. The power semiconductor chip includes a substrate, a semiconductor multilayer arrangement formed on the substrate, a source electrode and a drain electrode for the high-side switch formed on the semiconductor multilayer arrangement with a space between the source electrode and the drain electrode, a gate electrode for the high-side switch formed between the source electrode and the drain electrode, a drain lead trace, a first source lead trace, and a second source lead trace, and a first terminal, a second terminal, a third terminal, and a fourth terminal. The gate electrode is connected to the first terminal. The drain electrode and the second terminal are connected together through the drain lead trace. The source electrode and the third terminal are connected together through the first source lead trace. The source electrode and the fourth terminal are connected together through the second source lead trace. The second terminal and the third terminal are configured to cause a main current to flow between the second terminal and the third terminal.

According to the present disclosure, the power semiconductor chip includes the separate third and fourth terminals, and therefore, the source lead traces are formed in different paths in the power semiconductor chip. The ground path of the drive circuit and the path through which the main current flows are separated from each other, and therefore, the influence of parasitic inductance at the third terminal can be reduced, whereby power loss can be reduced without delaying turn-on and turn-off switching. Therefore, the efficiency of power conversion can be significantly improved in power supply circuits, typified by a DC-DC converter etc., which have an increasingly higher current and frequency.

DETAILED DESCRIPTION

Embodiments of a semiconductor device and a power conversion device according to the present disclosure will now be described in detail with reference to the accompanying drawings.

First Embodiment

Figure 1:
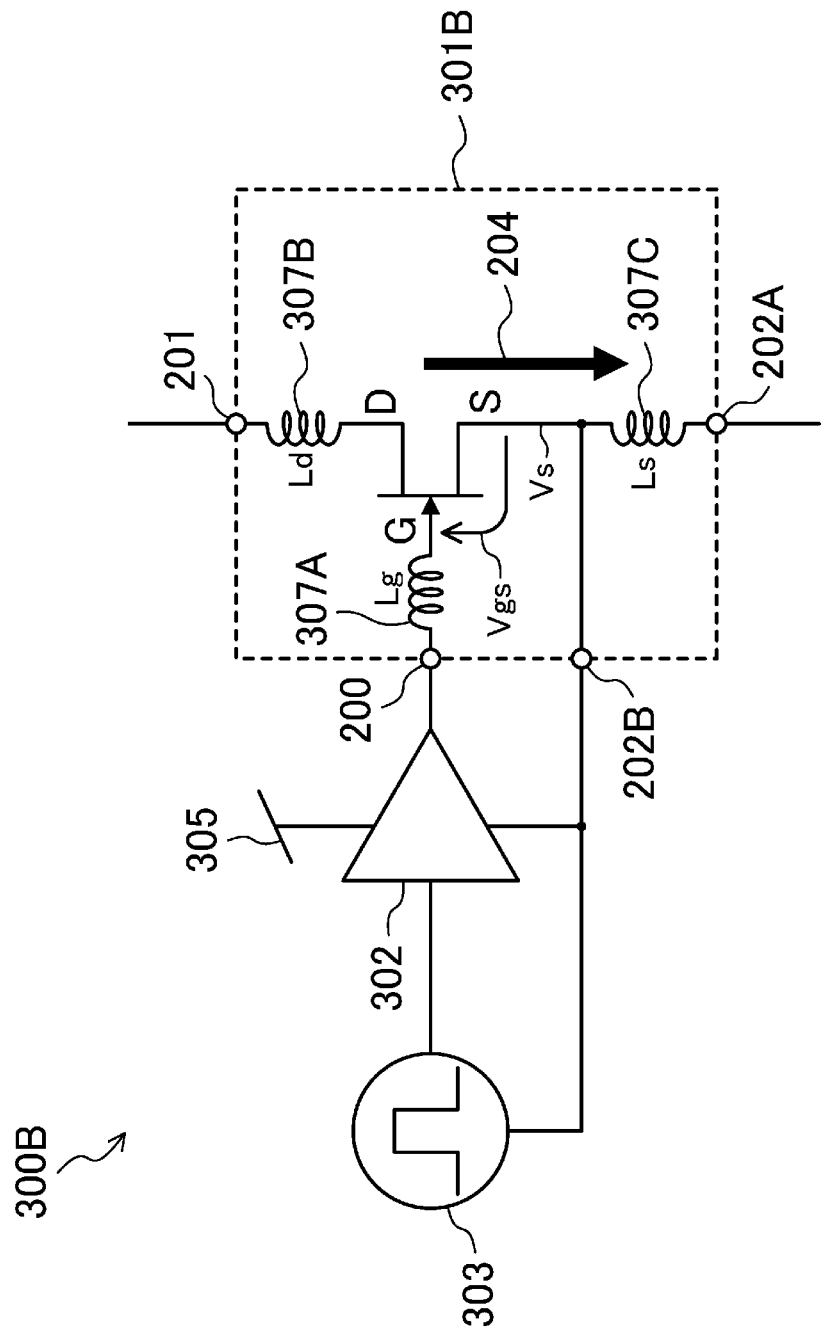
FIG. 1 is a circuit diagram showing a configuration of a switching device which is a semiconductor device according to a first embodiment of the present disclosure.

FIG. 1 is a circuit diagram showing a configuration of a switching device 300B which is a semiconductor device according to a first embodiment of the present disclosure. The switching device 300B of FIG. 1 includes a power semiconductor chip 301B, a drive circuit 302 which drives the power semiconductor chip 301B, a control signal source 303, and a logic power supply 305. The power semiconductor chip 301B includes a transistor having a gate electrode G, a drain electrode D, and a source electrode S, a gate terminal 200, a drain terminal 201, a first source terminal 202A, and a second source terminal 202B. In the power semiconductor chip 301B, there are gate parasitic inductance (Lg) 307A, drain parasitic inductance (Ld) 307B, and source parasitic inductance (Ls) 307C which are caused by the internal trace structure. A path through which a main current 204 flows is connected to the first source terminal 202A of the power semiconductor chip 301B through the source parasitic inductance 307C. A ground terminal of the drive circuit 302 is connected to the second source terminal 202B of the power semiconductor chip 301B.

Figure 2:
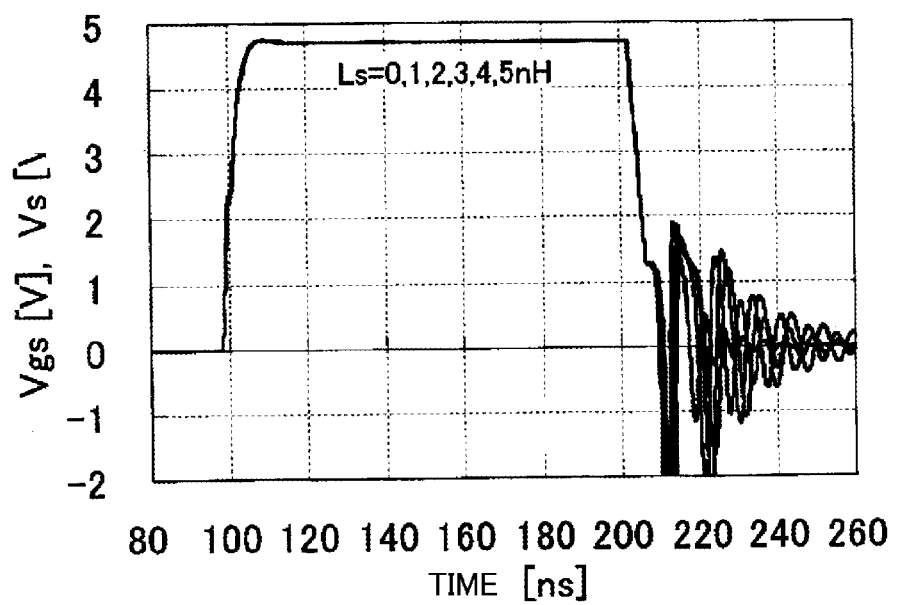
FIG. 2 is a waveform diagram showing that a gate-source voltage in the power semiconductor chip of FIG. 1 is not easily affected by source parasitic inductance.

FIG. 2 is a waveform diagram showing that the gate-source voltage Vgs in the power semiconductor chip 301B of FIG. 1 is not easily affected by the source parasitic inductance 307C. As can be seen from FIG. 2, even when the source parasitic inductance 307C caused by the internal trace structure of the power semiconductor chip 301B increases, the rise and fall characteristics of the gate-source voltage Vgs are not deteriorated. Because the second source terminal 202B is provided in the power semiconductor chip 301B in addition to the first source terminal 202A, a path through which the main current flows from the first source terminal 202A is separated from a path toward the ground terminal of the drive circuit 302. Therefore, the path toward the ground terminal of the drive circuit 302 is not substantially affected by induced electromotive force which is generated by the main current 204 flowing through the source parasitic inductance 307C, and therefore, the gate-source voltage Vgs which drives the power semiconductor chip 301B at high speed can be applied.

Figure 3:
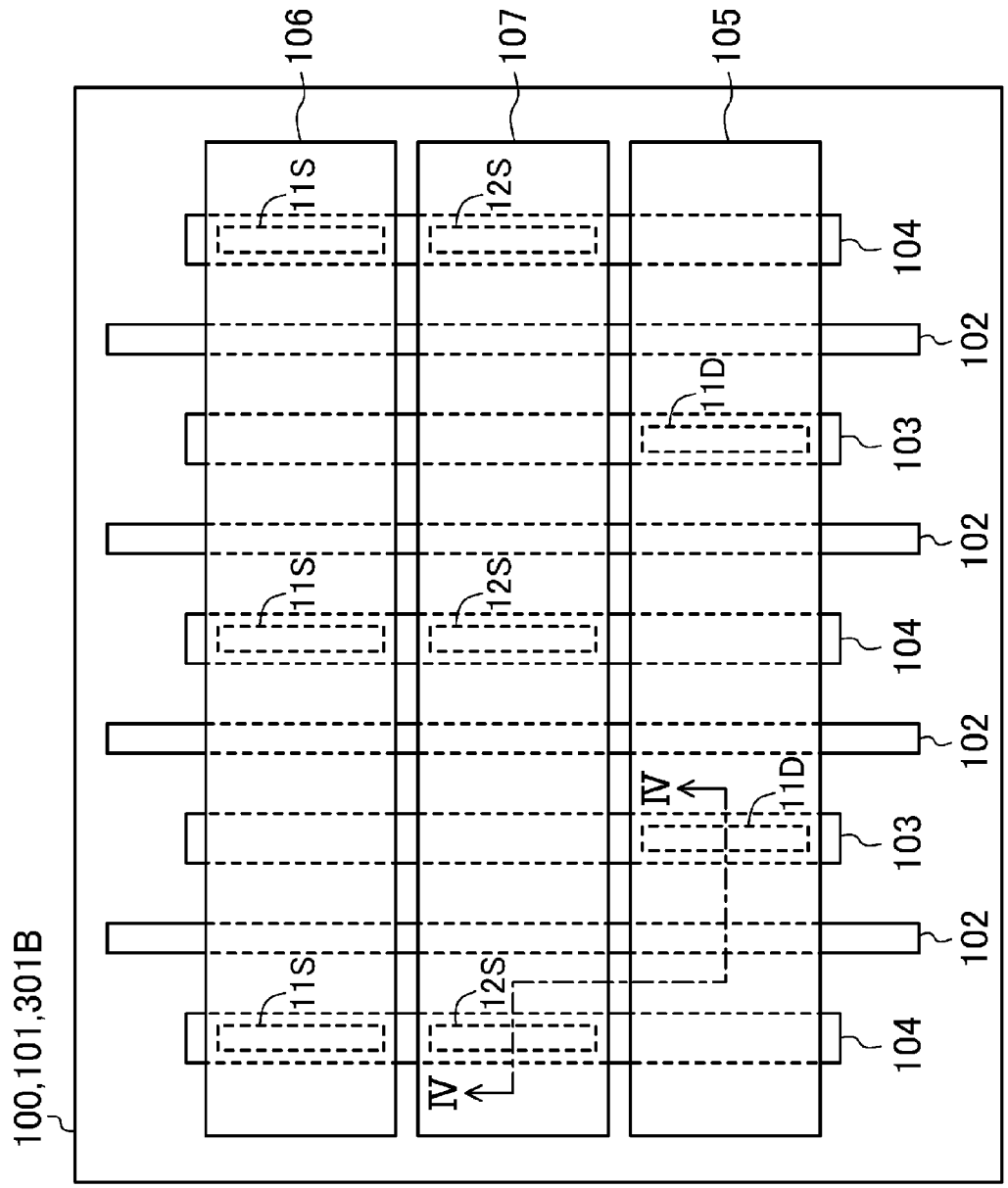
FIG. 3 is an enlarged plan view showing an electrode layout of the power semiconductor chip of FIG. 1.

FIG. 3 is an enlarged plan view showing an electrode layout of the power semiconductor chip 301B of FIG. 1. A semiconductor multilayer arrangement 101 is formed on a substrate 100, and drain electrodes 103 and source electrodes 104 are formed on the semiconductor multilayer arrangement 101 with a space between each electrode. Gate electrodes 102 are formed between the drain electrodes 103 and the source electrodes 104. Thus, the power semiconductor chip 301B has a horizontal device structure. The drain electrodes 103 are connected to a drain first-layer lead trace 105 through vias 11D. Similarly, the source electrodes 104 are connected to a first source first-layer lead trace 106 through first vias 11S and to a second source first-layer lead trace 107 through second vias 12S. The first source first-layer lead trace 106 is connected to the first source terminal 202A, and the second source first-layer lead trace 107 is connected to the second source terminal 202B.

Thus, the second source first-layer lead trace 107 is connected to the second source terminal 202B which is different from the first source terminal 202A, and therefore, is not connected at the second source terminal 202B to the source parasitic inductance 307C at the first source terminal 202A. As a result, the influence of the source parasitic inductance 307C can be reduced at the second source terminal 202B.

Note that the second source first-layer lead trace 107 is preferably formed between the first source first-layer lead trace 106 and the drain first-layer lead trace 105.

Figure 4:
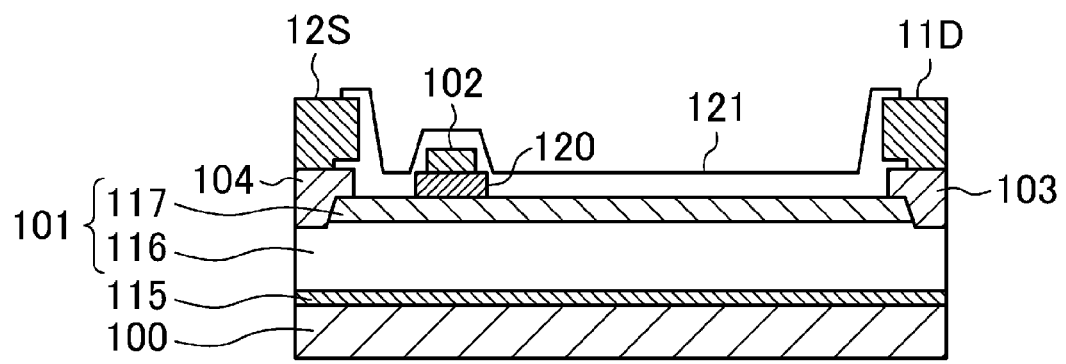
FIG. 4 is a cross-sectional view taken along line IV-IV of FIG. 3.

FIG. 4 is a cross-sectional view taken along line IV-IV of FIG. 3, showing a nitride semiconductor transistor as an example. As shown in FIG. 4, the semiconductor multilayer arrangement 101 is formed on the conductive substrate 100 of silicon (Si) with a buffer layer 115 of aluminum nitride (AlN) having a thickness of 100 nm being interposed therebetween. The semiconductor multilayer arrangement 101 includes a first layer 116 of undoped gallium nitride (GaN) having a thickness of 2 µm, and a second layer 117 of undoped aluminum gallium nitride (AlGaN) having a thickness of 20 nm, which are successively formed in this order. Electric charge occurs in the vicinity of the heterointerface between the first layer 116 and the second layer 117 due to spontaneous and piezoelectric polarization.

As a result, a channel region is generated which has a two-dimensional electron gas (2 DEG) layer having a sheet carrier density of $1\times10^{13}$ cm$^{-2}$ or more and a mobility of 1000 cm$^2$ V/sec or more. The drain electrodes 103 and the source electrodes 104 are formed on the semiconductor multilayer arrangement 101 with a space between each electrode.

The drain electrode 103 and the source electrode 104, which have a multilayer structure of titanium (Ti) and aluminum (Al), are in ohmic contact with the channel region. The gate electrode 102 is formed on the semiconductor multilayer arrangement 101 in a region between the drain electrode 103 and the source electrode 104, with a p-type nitride semiconductor layer 120 being interposed between the gate electrode 102 and the semiconductor multilayer arrangement 101. The gate electrode 102, which has a multilayer structure of palladium (Pd) and gold (Au), is in ohmic contact with the p-type nitride semiconductor layer 120. The p-type nitride semiconductor layer 120 has a thickness of 300 nm and is formed of p-type GaN doped with magnesium (Mg). A p-n junction is formed between the p-type nitride semiconductor layer 120 and the second layer 117. As a result, even when a voltage of 0 V is applied to the gate electrode 102, a depletion layer spreads from the p-type nitride semiconductor layer 120 into the second layer 117 and the first layer 116 toward the substrate 100 and the source electrode 104 or the drain electrode 103. Therefore, even when a voltage of 0 V is applied to the gate electrode 102, a current flowing through the channel region is shut off, and therefore, normally-off operation can be performed.

Also, when a gate-source voltage of 3 V or more which exceeds the built-in potential of the p-n junction is applied to the gate electrode 102, positive holes can be injected into the channel region. Because the mobility of positive holes is much lower than that of electrons in nitride semiconductors, positive holes injected into the channel region do not substantially contribute to carriers which cause a current. Therefore, the injected positive holes generate the same amount of electrons in the channel region, thereby improving the effect of generating electrons in the channel region, i.e., function as donor ions. In other words, the density of carriers can be modulated in the channel region, and therefore, a normally-off power semiconductor element having a large operating current and a low resistance can be implemented.

An insulating layer 121 of silicon nitride (SiN) etc. is formed on the semiconductor multilayer arrangement 101, covering a portion of the drain electrode 103, a portion of the source electrode 104, and the gate electrode 102. The insulating layer 121 has openings through which the via 11D for the drain electrode 103 and the via 12S for the source electrode 104 are exposed.

Figure 5:
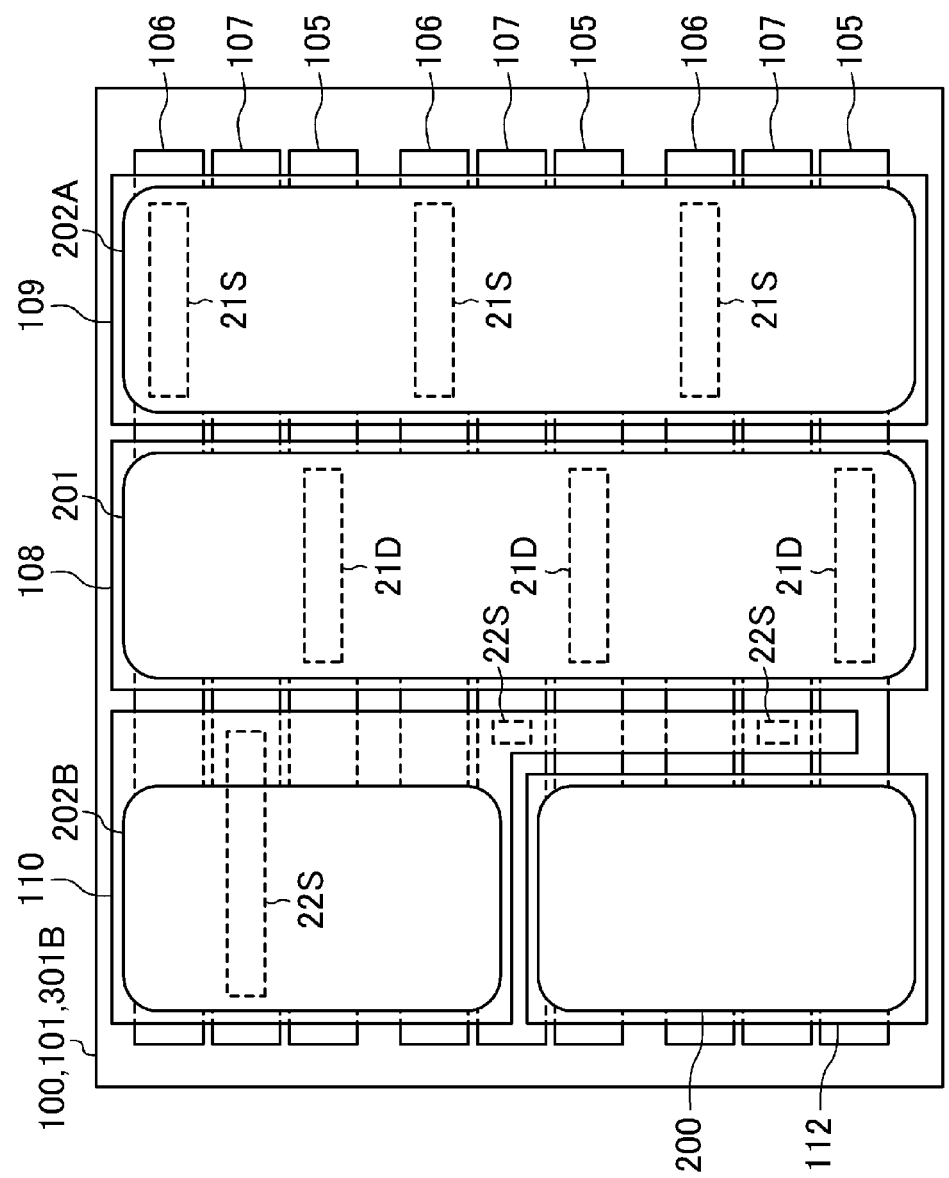
FIG. 5 is a plan view showing a terminal layout of the power semiconductor chip of FIG. 1.

FIG. 5 is a plan view showing a terminal layout of the power semiconductor chip 301B of FIG. 1. Connection terminals are formed on the power semiconductor chip 301B, which structure is called a "pad-on-element" structure. A plurality of the drain first-layer lead traces 105 of FIG. 3, a plurality of the first source first-layer lead traces 106 of FIG. 3, and a plurality of the second source first-layer lead traces 107 of FIG. 3 are formed, extending in a horizontal direction. The drain first-layer lead traces 105 are connected to a drain second-layer lead trace 108 through vias 21D. Similarly, the first source first-layer lead traces 106 are connected to a first source second-layer lead trace 109 through first vias 21S, and the second source first-layer lead traces 107 are connected to a second source second-layer lead trace 110 through second vias 22S, i.e., each of these traces is connected to the corresponding trace through a different path. The gate terminal 200 is connected to the gate electrode 102 through a gate trace 112, although not shown. The drain terminal 201 is connected to the drain second-layer lead trace 108, the first source terminal 202A is connected to the first source second-layer lead trace 109, and the second source terminal 202B is connected to the second source second-layer lead trace 110. As a result, the source electrode 104 can be connected to the first source terminal 202A and the second source terminal 202B through different paths.

Note that the drain first-layer lead trace 105, the first source first-layer lead trace 106, and the second source first-layer lead trace 107 are each preferably an elongated trace extending in a horizontal or vertical direction.

Figure 6:
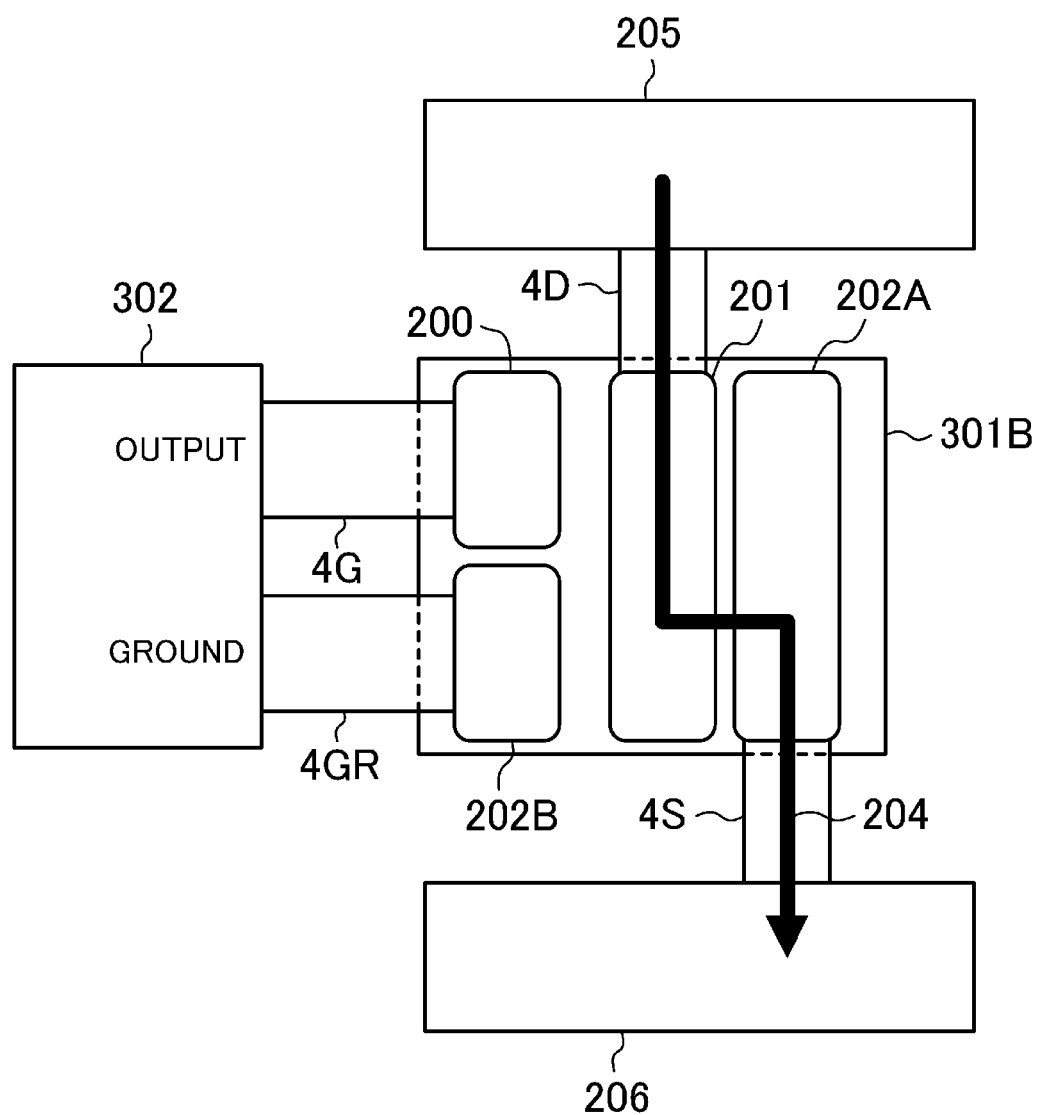
FIG. 6 is a plan view showing a layout of the power semiconductor chip of FIG. 1 on a printed circuit board.

FIG. 6 is a plan view showing a layout of the power semiconductor chip 301B of FIG. 1 on a printed circuit board. An output of the drive circuit 302 is connected to the gate terminal 200 of the power semiconductor chip 301B through a printed circuit board trace 4G. The drain terminal 201 of the power semiconductor chip 301B is connected to a drain region 205 of the printed circuit board through a printed circuit board trace 4D. The first source terminal 202A of the power semiconductor chip 301B is connected to a source region 206 of the printed circuit board through a printed circuit board trace 4S. A ground terminal of the drive circuit 302 is connected to the second source terminal 202B of the power semiconductor chip 301B through a printed circuit board trace 4GR. Note that the drive circuit 302 is grounded at the source. A main current 204 flowing through the printed circuit board flows from the drain region 205 of the printed circuit board to the source region 206 of the printed circuit board through the drain terminal 201 and the first source terminal 202A of the power semiconductor chip 301B.

Figure 7:
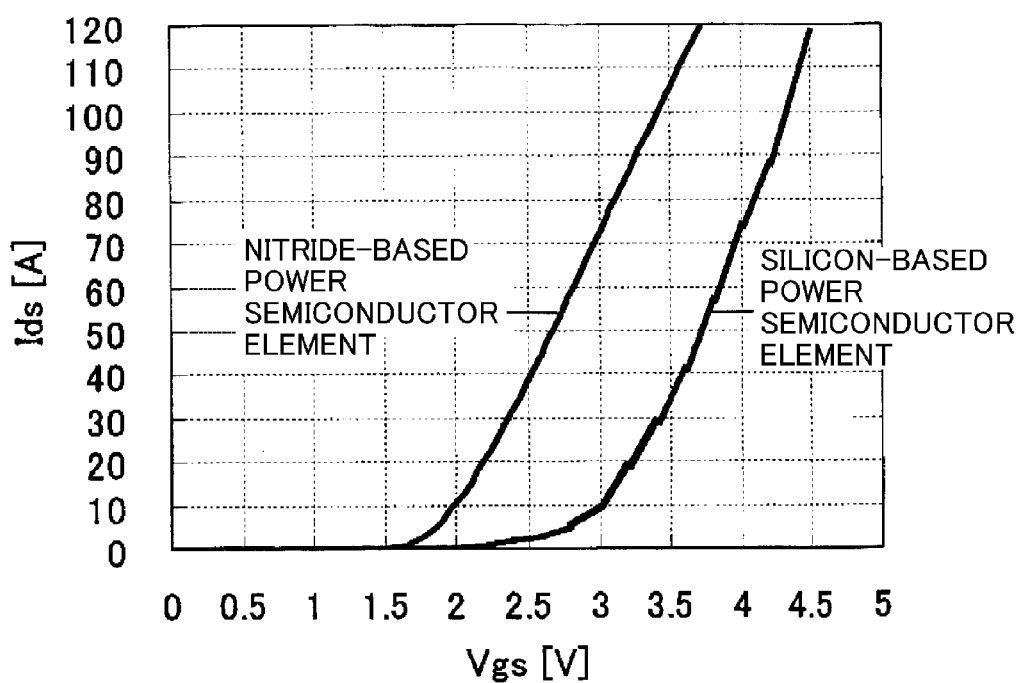
FIG. 7 is a diagram showing voltage-current characteristics, where a nitride-based power semiconductor element and a silicon-based power semiconductor element are compared with each other.

FIG. 7 is a diagram showing voltage-current characteristics, i.e., a relationship between a gate-source voltage Vgs and a drain current Ids, where a nitride-based power semiconductor element and a silicon-based power semiconductor element are compared with each other. As shown in FIG. 7, there are inherent characteristics that the nitride-based power semiconductor element has a lower on-state voltage than that of the silicon-based power semiconductor element. Therefore, the nitride-based power semiconductor element is more easily affected by source parasitic inductance than the silicon-based power semiconductor element, and therefore, advantages of the present disclosure are more significant in the nitride-based power semiconductor element. Therefore, the power semiconductor chip 301B preferably includes a nitride-based power semiconductor element.

Second Embodiment

Figure 8:
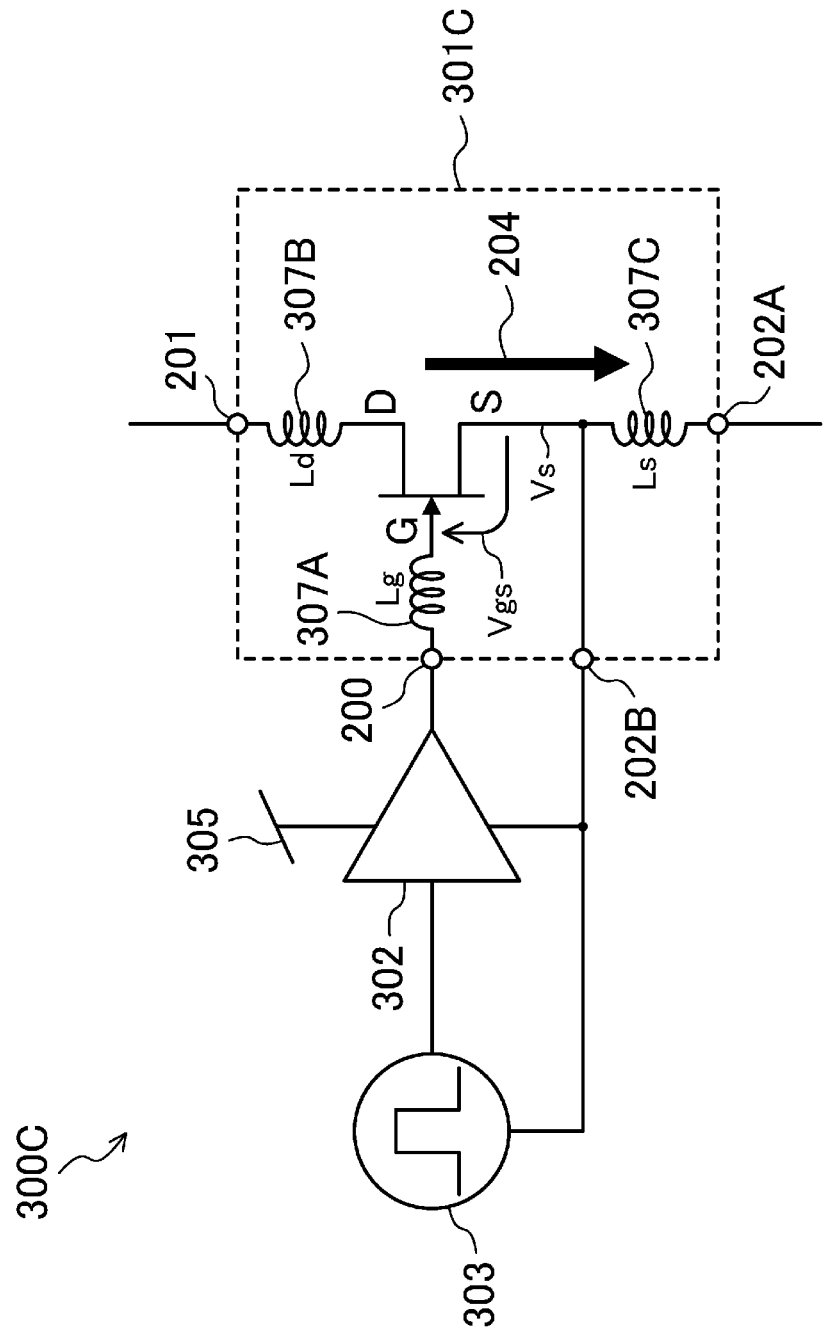
FIG. 8 is a circuit diagram showing a configuration of a switching device which is a semiconductor device according to a second embodiment of the present disclosure.

FIG. 8 is a circuit diagram showing a configuration of a switching device 300C which is a semiconductor device according to a second embodiment of the present disclosure. The switching device 300C of FIG. 8 includes a power semiconductor chip 301C, a drive circuit 302 which drives the power semiconductor chip 301C, a control signal source 303, and a logic power supply 305. This configuration is different from that of the first embodiment (FIG. 1) only in the power semiconductor chip 301C.

Figure 9:
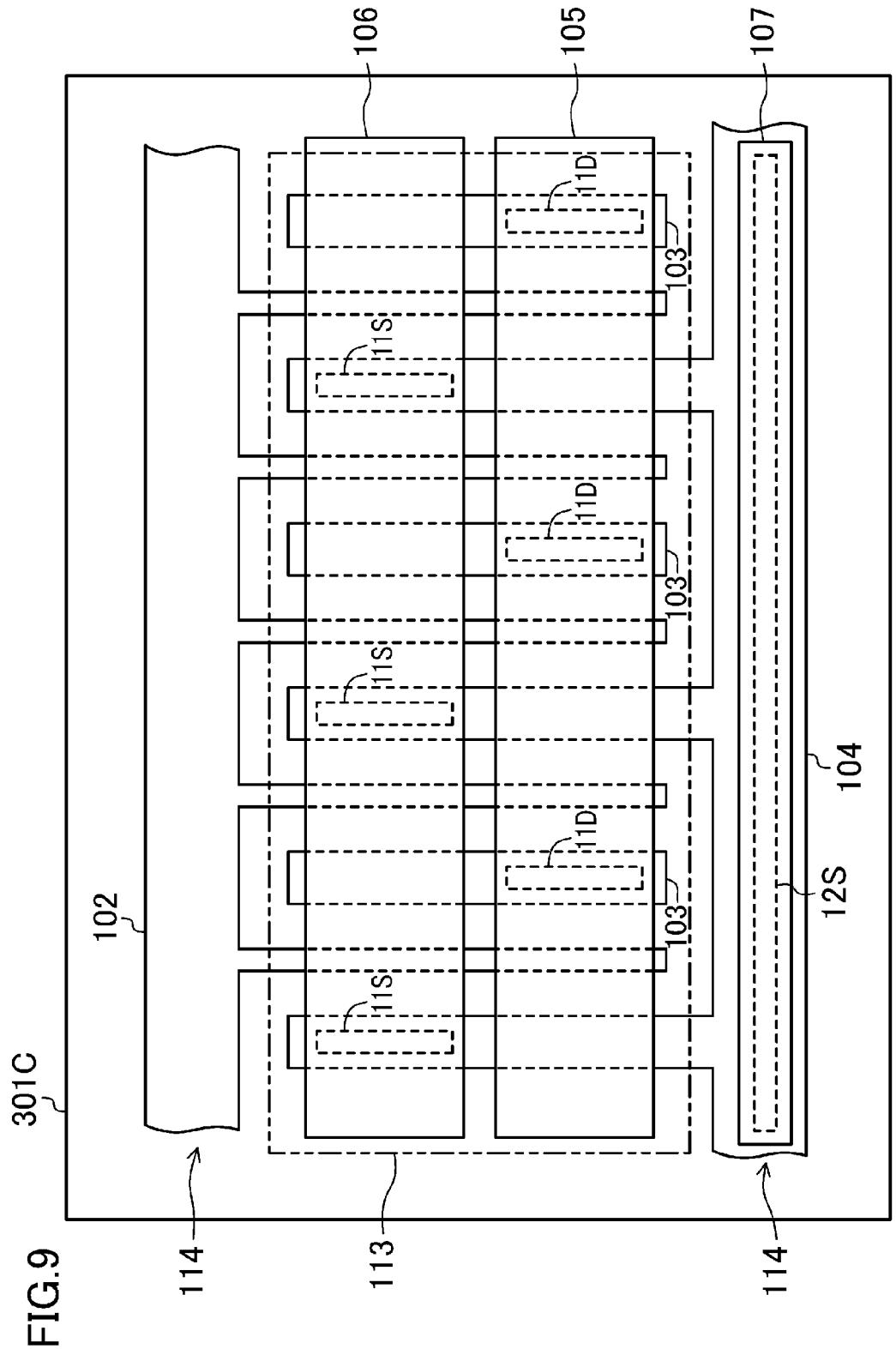
FIG. 9 is an enlarged plan view showing an electrode layout of the power semiconductor chip of FIG. 8.

FIG. 9 is an enlarged plan view showing an electrode layout of the power semiconductor chip 301C of FIG. 8. The power semiconductor chip 301C has an active region 113 in which a power semiconductor element is formed, and the other region, i.e., an inactive region 114. A gate electrode 102 is formed between drain electrodes 103 and a source electrode 104. The gate electrode 102 and the source electrode 104 each have a comb-shaped electrode structure. The drain electrodes 103 are connected to a drain first-layer lead trace 105 through vias 11D. The source electrode 104 is connected to a first source first-layer lead trace 106 through first vias 11S and to a second source first-layer lead trace 107 through second vias 12S. The second source first-layer lead trace 107 is formed on the comb-shaped electrode structure of the inactive region 114, whereby the drain first-layer lead trace 105 and the first source first-layer lead trace 106 formed in the active region 113 can each have a wider trace width.

Here, the first source first-layer lead trace 106 is connected to a first source terminal 202A, and the second source first-layer lead trace 107 is connected to a second source terminal 202B, although not shown. As a result, according to this embodiment, the drain first-layer lead trace 105 and the first source first-layer lead trace 106 can deal with a higher current density, and allow for flow of a main current 204 having a current value of several tens of amperes, for example.

Note that the second source first-layer lead trace 107 may deal with a small current in order to allow the ground terminal of the drive circuit 302 to be connected thereto. Therefore, the second source first-layer lead trace 107 may have a smaller trace width than that of each of the drain first-layer lead trace 105 and the first source first-layer lead trace 106.

As a variation of this embodiment, the second source first-layer lead trace 107 may be formed in the same trace layer in which the source electrode 104 is formed.

Third Embodiment

Figure 10:
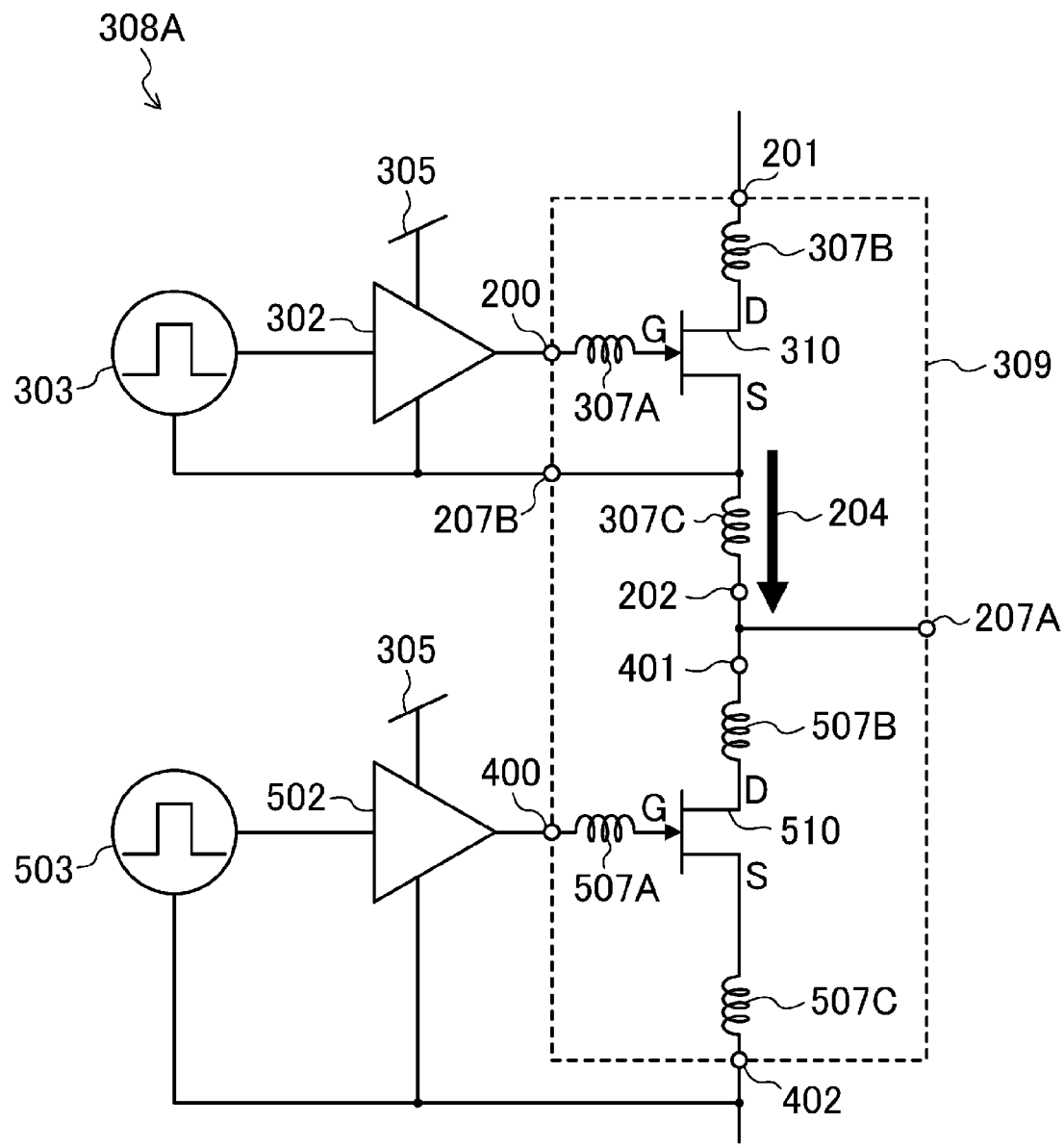
FIG. 10 is a circuit diagram showing a portion of a configuration of a DC-DC converter which is a power conversion device according to a third embodiment of the present disclosure.

FIG. 10 is a circuit diagram showing a portion of a configuration of a DC-DC converter 308A which is a power conversion device according to a third embodiment of the present disclosure. The DC-DC converter 308A of FIG. 10 includes a power semiconductor chip 309 having a half-bridge configuration in which a high-side switch and a low-side switch are integrated on the same substrate, drive circuits 302 and 502 which drive these switches, control signal sources 303 and 503, and a logic power supply 305.

In the power semiconductor chip 309, a high-side switch 310 and a low-side switch 510 each of which is a power semiconductor element are formed on the same substrate. As a result, a source terminal 202 of the high-side switch 310 and a drain terminal 401 of the low-side switch 510 can be disposed close to each other. Therefore, parasitic inductance can be significantly reduced which is disadvantageously caused due to wire bonding or package traces when a half bridge is configured using discrete parts.

In the high-side switch 310 and the low-side switch 510, there are gate parasitic inductances 307A and 507A, drain parasitic inductance 307B and 507B, and source parasitic inductances 307C and 507C due to the internal trace structure. In particular, the source parasitic inductance 307C of the high-side switch 310 causes induced electromotive force, which in turn delays the gate drive of the drive circuit 302, likely leading to an increase in power loss.

Therefore, the power semiconductor chip 309 of FIG. 10 has a high-side gate terminal 200 which receives an output signal of the drive circuit 302, a low-side gate terminal 400 which receives an output signal of the drive circuit 502, a drain terminal 201 which is connected to an input power supply, a source terminal 402 which is connected to a ground voltage, a first output terminal 207A, and a second output terminal 207B. The first output terminal 207A and the second output terminal 207B are connected to a source electrode of the high-side switch 310 through different lead traces. The first output terminal 207A is connected to a load inductance, and the second output terminal 207B is connected to a ground terminal of the drive circuit 302.

Figure 11:
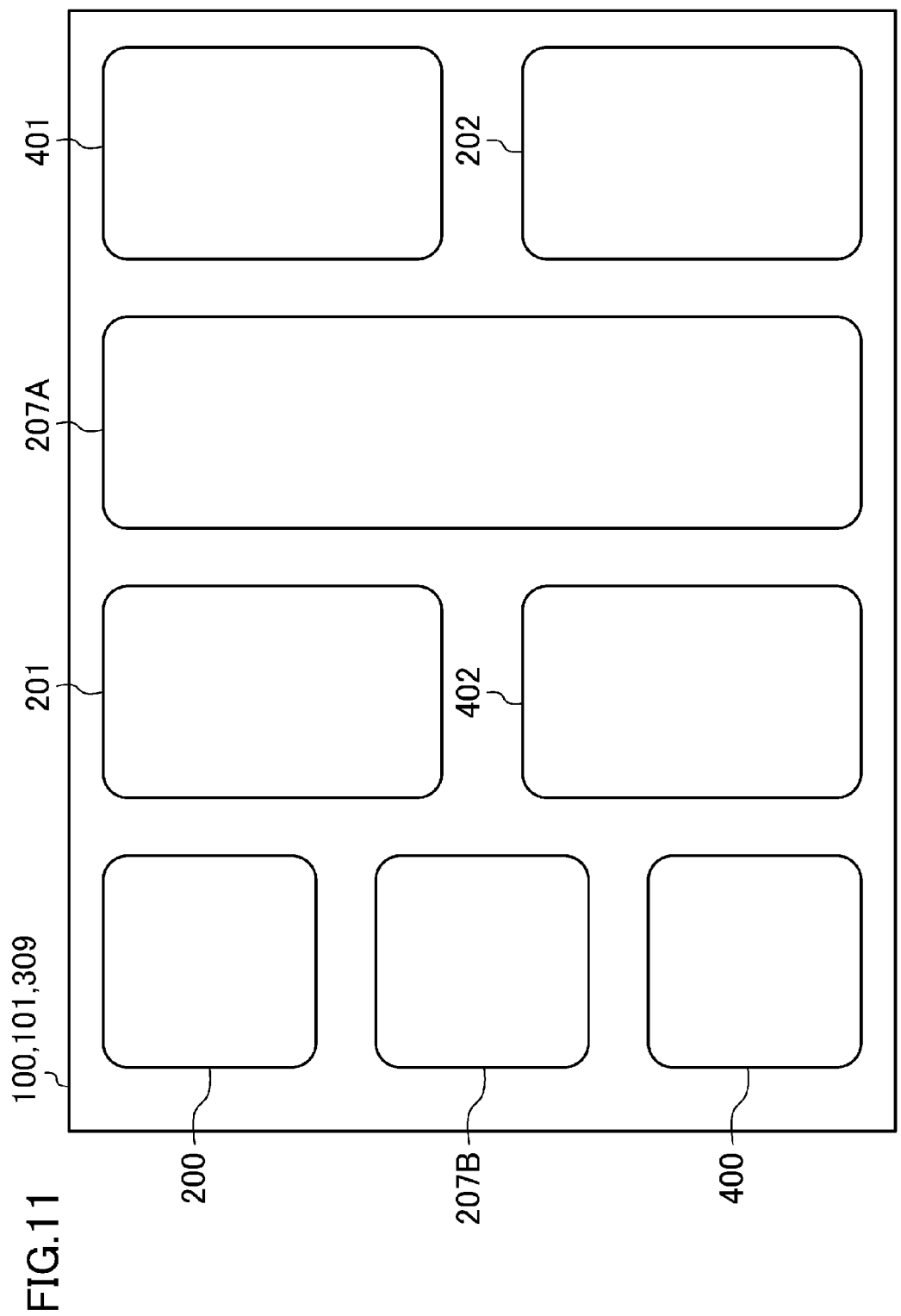
FIG. 11 is a plan view showing a terminal layout of a power semiconductor chip having a half-bridge configuration of FIG. 10.

FIG. 11 is a plan view showing a terminal layout of the power semiconductor chip 309 of FIG. 10. Electrodes and lead traces in the high-side switch 310 have a structure similar to that of FIG. 3 or FIG. 9. The gate terminals 200 and 400 are connected to gate electrodes of the high-side switch 310 and the low-side switch 510, respectively. The drain terminal 201 is connected to a drain electrode of the high-side switch 310 through a lead trace. The source terminal 402 is connected to a source electrode of the low-side switch 510 through a lead trace. The source electrode of the high-side switch 310 is connected to the first output terminal 207A through a first source first-layer lead trace and a first source second-layer lead trace and to the second output terminal 207B through a second source first-layer lead trace and a second source second-layer lead trace, i.e., each of these electrodes is connected to the corresponding terminal through a different path (see FIG. 5).

Figure 12:
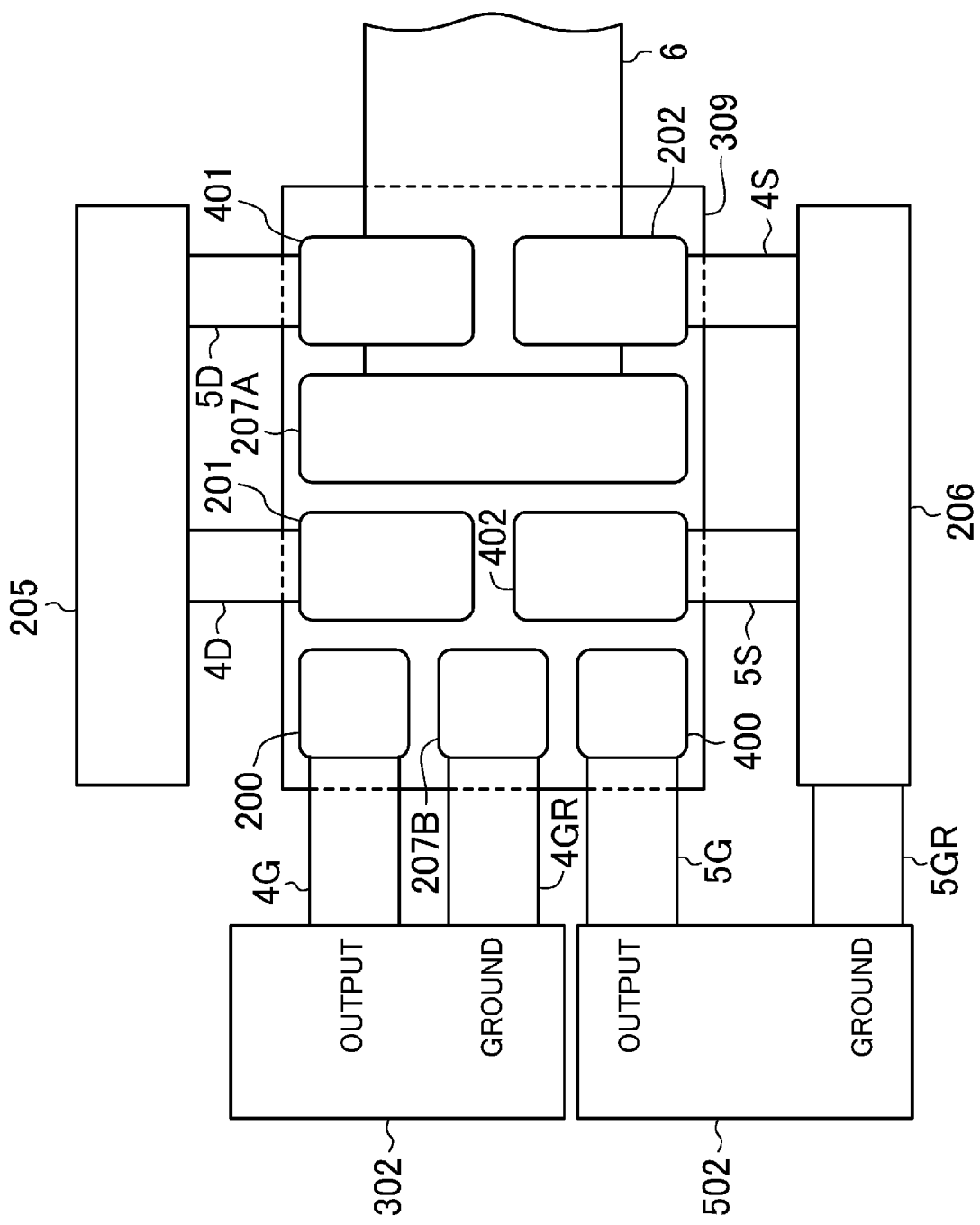
FIG. 12 is a plan view showing a layout of the power semiconductor chip having the half-bridge configuration of FIG. 10 on a printed circuit board.

FIG. 12 is a plan view showing a layout of the power semiconductor chip 309 of FIG. 10 on a printed circuit board. An output of the high-side drive circuit 302 is connected to the high-side gate terminal 200 of the power semiconductor chip 309 through a printed circuit board trace 4G. The drain terminal 201 of the power semiconductor chip 309 is connected to a drain region 205 of the printed circuit board through a printed circuit board trace 4D. The high-side source terminal 202 of the power semiconductor chip 309 is connected to a source region 206 of the printed circuit board through a printed circuit board trace 4S. A ground terminal of the high-side drive circuit 302 is connected to the second output terminal 207B of the power semiconductor chip 309 through a printed circuit board trace 4GR.

An output of the low-side drive circuit 502 is connected to the low-side gate terminal 400 of the power semiconductor chip 309 through a printed circuit board trace 5G. The low-side drain terminal 401 of the power semiconductor chip 309 is connected to the drain region 205 of the printed circuit board through a printed circuit board trace 5D. The source terminal 402 of the power semiconductor chip 309 is connected to the source region 206 of the printed circuit board through a printed circuit board trace 5S. A ground terminal of the low-side drive circuit 502 is connected to the source region 206 of the printed circuit board through a printed circuit board trace 5GR. The first output terminal 207A through which a main current 204 flows is connected to load inductance (not shown) through a printed circuit board trace 6.

According to this embodiment, the source electrode of the high-side switch 310 is connected to the first output terminal 207A and the second output terminal 207B separately through different paths. Therefore, a path through which the main current 204 flows from the source electrode of the high-side switch 310 can be separated from a ground path of the drive circuit 302 which drives the gate electrode of the high-side switch 310. Therefore, the influence of induced electromotive force which is generated by the main current 204 flowing through the source parasitic inductance 307C caused by the internal lead trace of the high-side switch 310, on the gate-source voltage of the high-side switch 310, can be reduced or prevented, whereby the efficiency of power conversion can be improved.

Fourth Embodiment

Figure 13:
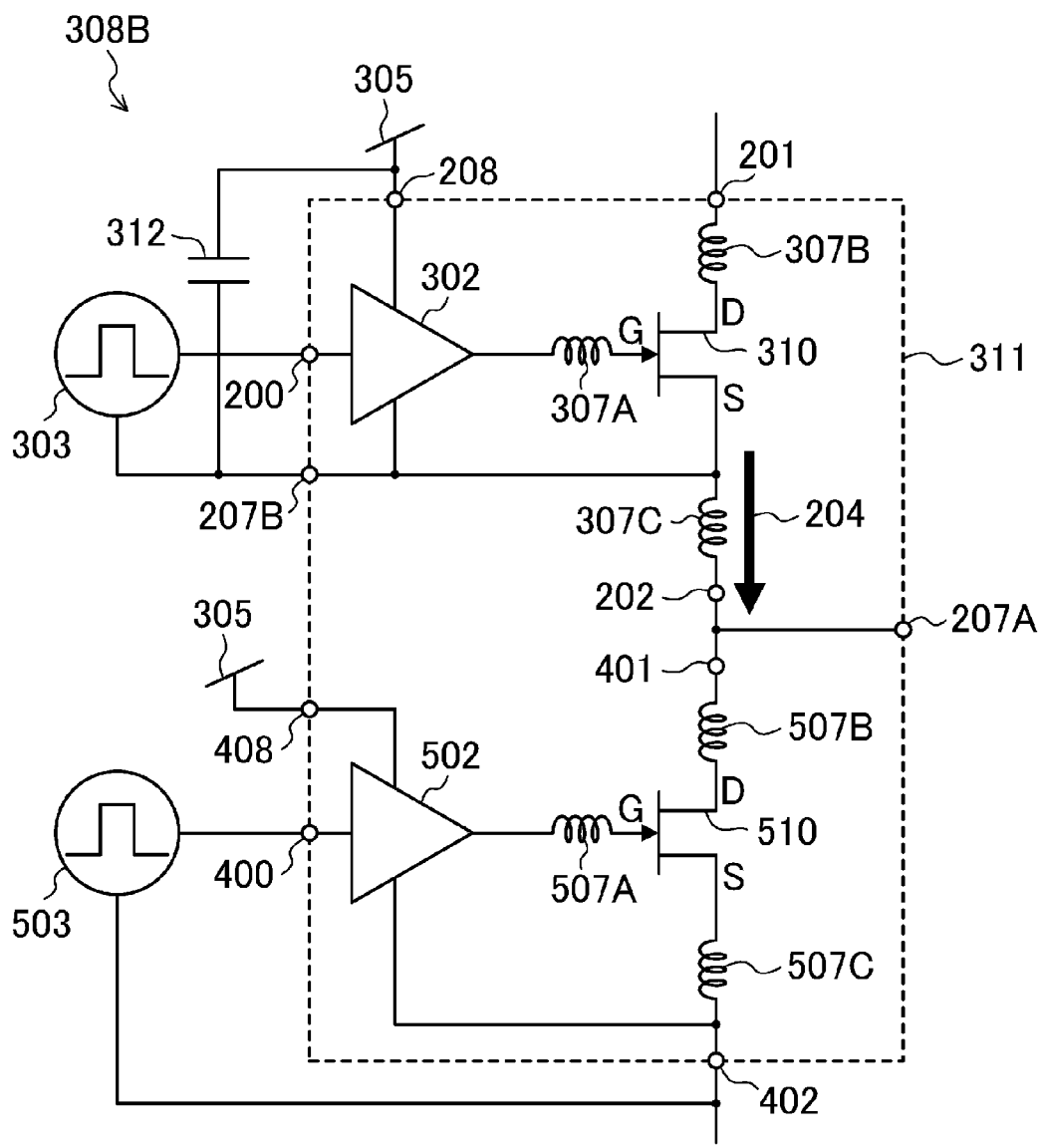
FIG. 13 is a circuit diagram showing a portion of a configuration of a DC-DC converter which is a power conversion device according to a fourth embodiment of the present disclosure.
Figure 14:
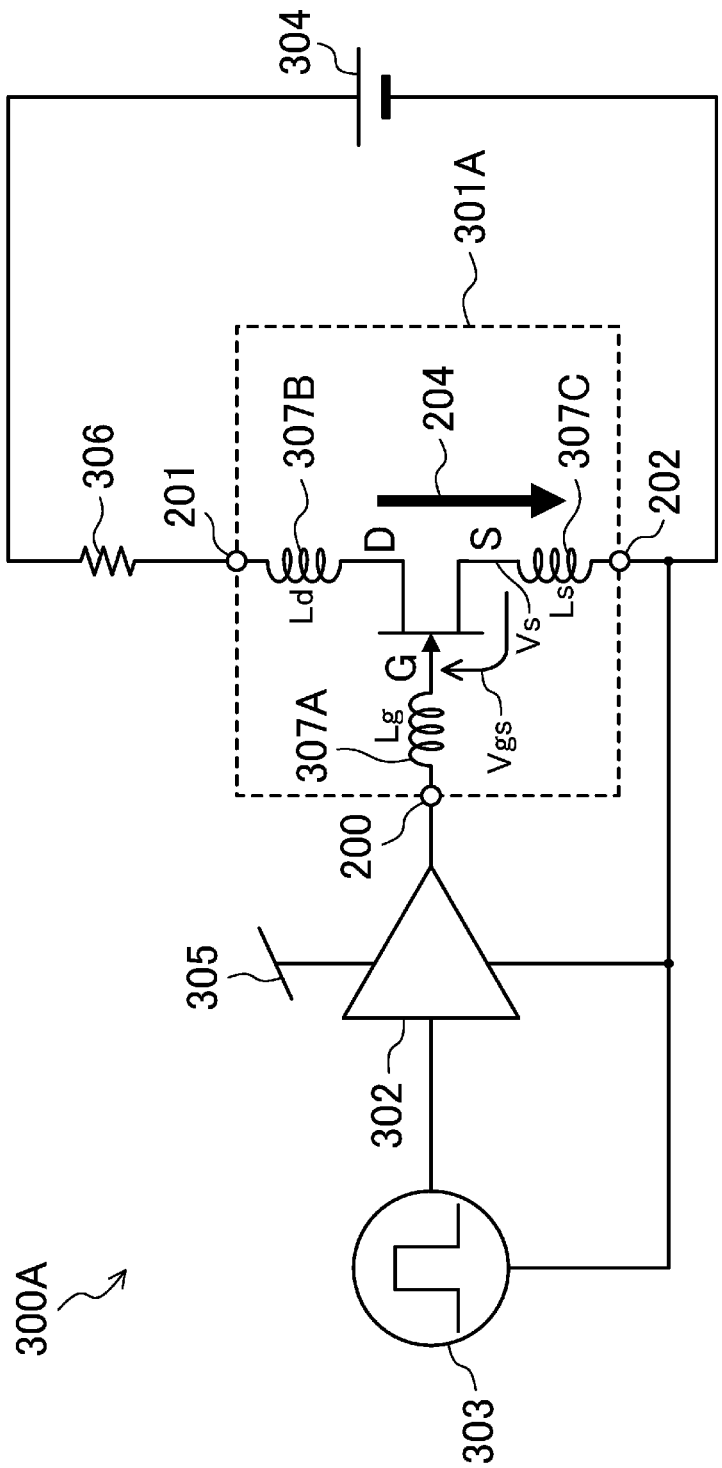
FIG. 14 is a circuit diagram showing a configuration of a switching device which is a conventional semiconductor device.
Figure 15:
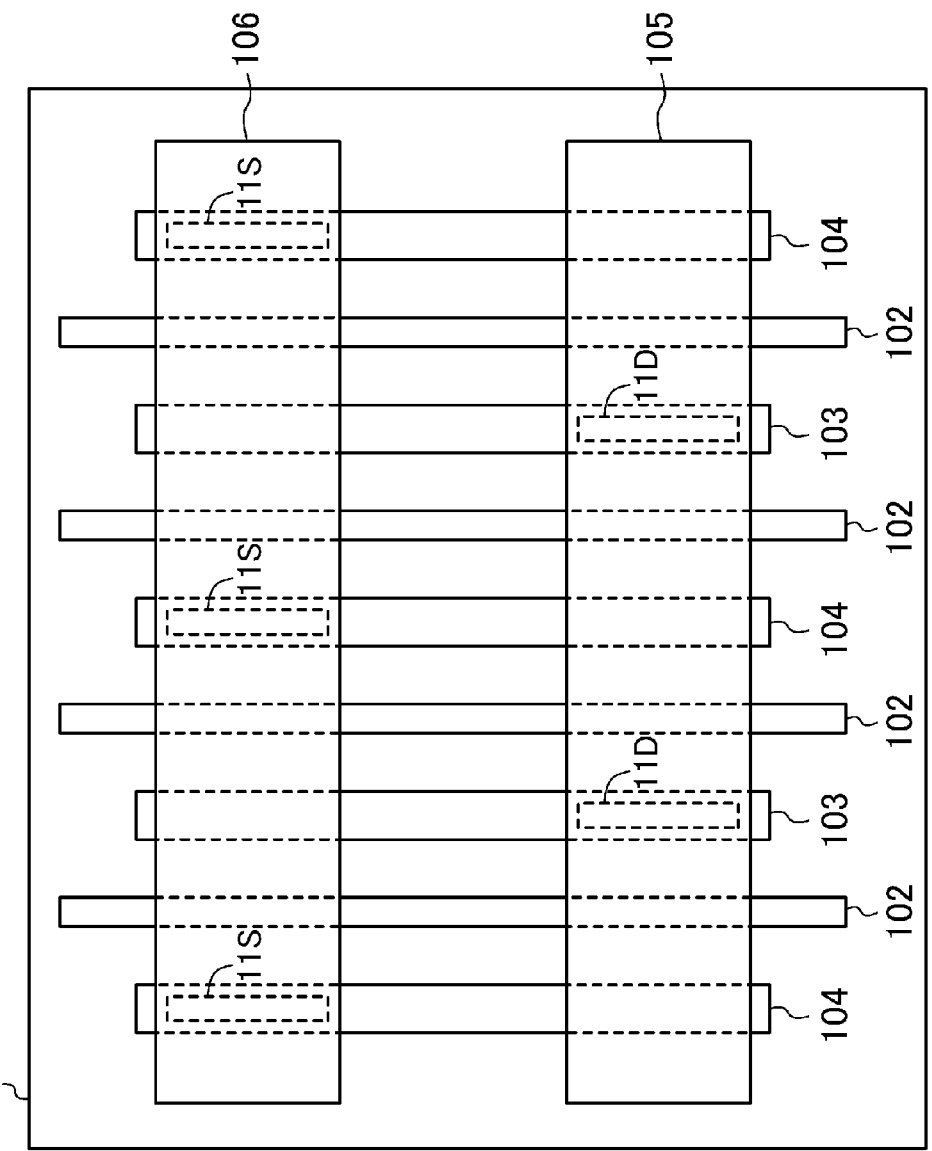
FIG. 15 is an enlarged plan view showing an electrode layout of a power semiconductor chip of FIG. 14.
Figure 16:
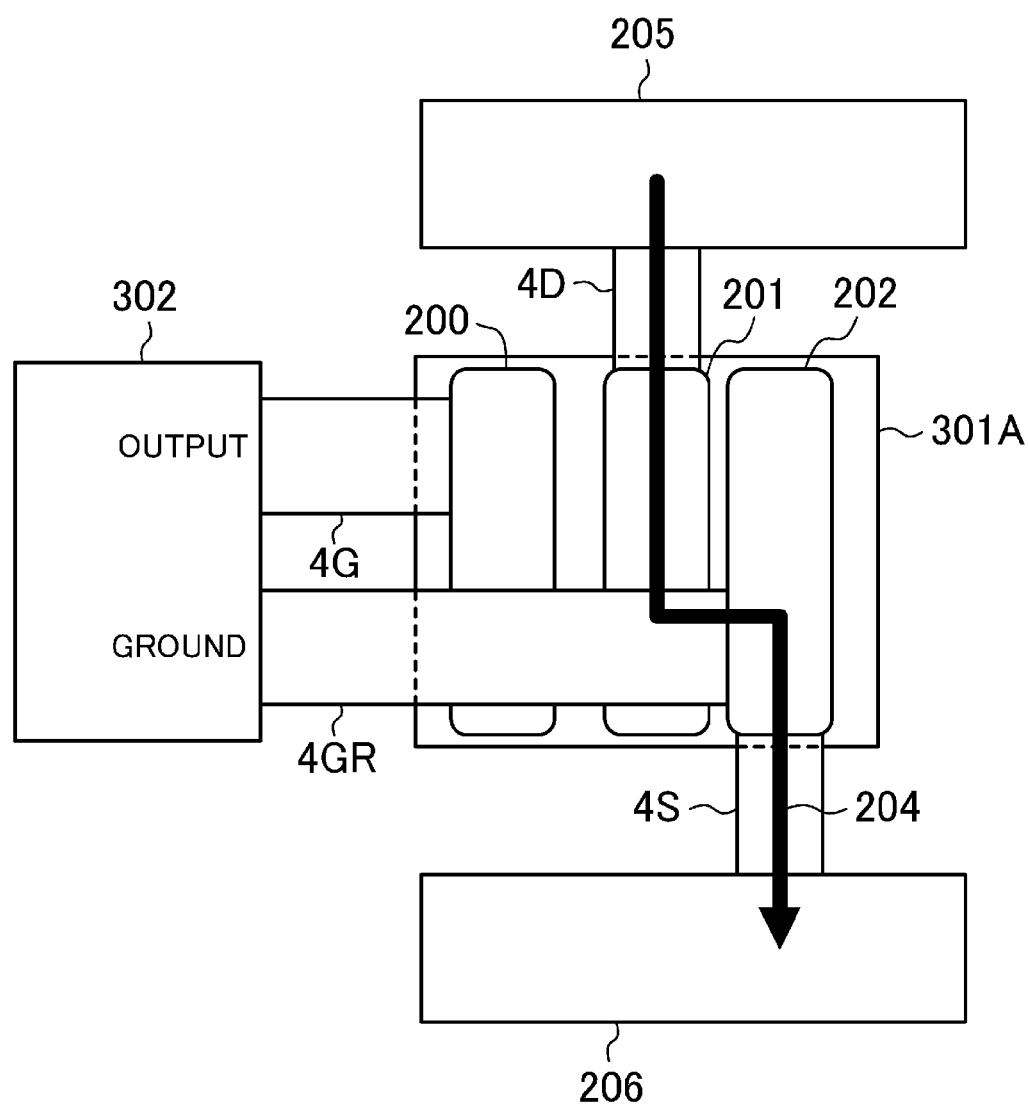
FIG. 16 is a plan view showing a layout of the power semiconductor chip of FIG. 14 on a printed circuit board.
Figure 17:
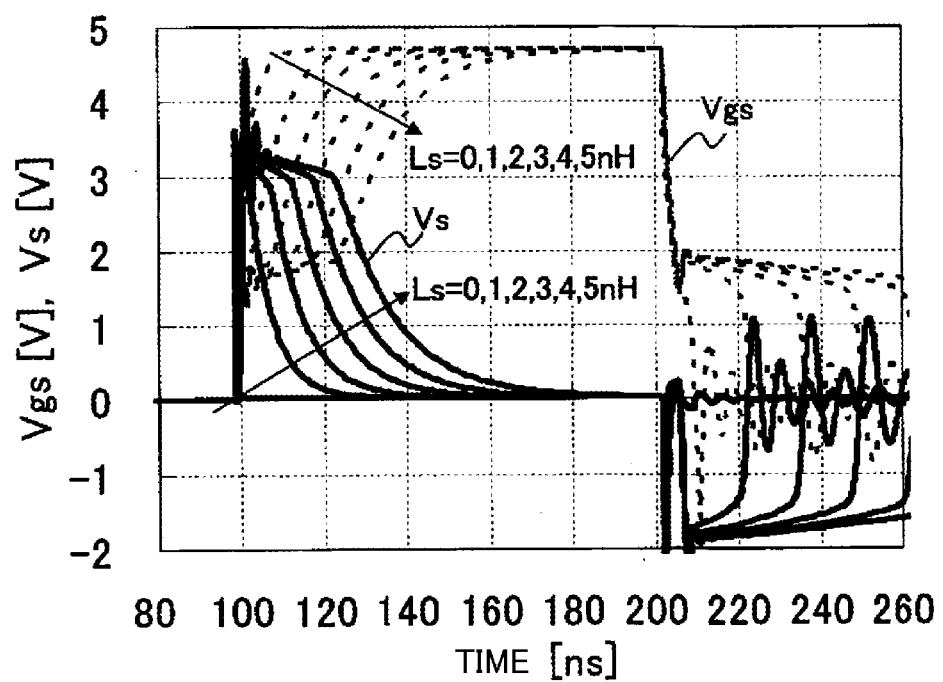
FIG. 17 is a waveform diagram showing that a gate-source voltage and a source voltage in the power semiconductor chip of FIG. 14 are easily affected by source parasitic inductance.

FIG. 13 is a circuit diagram showing a portion of a configuration of a DC-DC converter 308B which is a power conversion device according to a fourth embodiment of the present disclosure. The DC-DC converter 308B of FIG. 13 includes a power semiconductor chip 311 with a half-bridge configuration which functions as a DC-DC converter integrated circuit chip, control signal sources 303 and 503, and a logic power supply 305. In the power semiconductor chip 311, a high-side switch 310 and a low-side switch 510 which form a half bridge, and drive circuits 302 and 502 which drive these switches, are formed on the same substrate.

The power semiconductor chip 311 also includes logic power supply terminals 208 and 408 to which a voltage is applied from the logic power supply 305, gate terminals 200 and 400 to which a signal is input from the control signal sources 303 and 503, a drain terminal 201 which is connected to an input power supply, a source terminal 402 which is connected to a ground voltage, a first output terminal 207A which is connected to a load inductance and through which a main current 204 flows, and a second output terminal 207B which is connected to a boot strap capacitor 312.

According to this embodiment, the influence of induced electromotive force which is generated by the main current 204 flowing through source parasitic inductance 307C caused by the internal lead trace of the high-side switch 310, on the gate-source voltage of the high-side switch 310, can be reduced or prevented. In addition, the high-side switch 310 and the low-side switch 510, and the drive circuits 302 and 502 which drive these switches, are integrated on the same substrate. Therefore, the parasitic inductance of the gate electrode of the power semiconductor element can be significantly reduced which is caused due to wire bonding or traces of the printed circuit board, compared to when discrete parts are used.

Note that, in the first to fourth embodiments described above, the power semiconductor element used therein is not limited to an AlGaN/GaN FET, and may be a FET having Si as a material, a FET having SiC as a material, a FET having SiGe or SiGeC as a material, or a FET having a group III-V compound, such as GaAs, AlGaAs, etc., as a material.

In the first to fourth embodiments, the molar fraction of each component of AlGaN and GaN can be suitably selected.

In addition to the FETs described above, other FETs may be employed, such as a heterojunction field-effect transistor (HFET), a junction field-effect transistor (JFET), a MOSFET, or a gate insulating film transistor (MISFET).

In addition to FETs, a bipolar transistor, an IGBT, etc., may be employed as the power semiconductor element.

A MOSFET, a JFET, or an HFET may be employed as the drive circuit.

In the semiconductor device of the present disclosure, power loss can be reduced which occurs due to parasitic inductance at the source caused by the internal trace structure of the power semiconductor chip. Therefore, the semiconductor device of the present disclosure is useful for increasing the efficiency of power conversion performed by a power conversion device, such as a DC-DC converter etc.

What is claimed is:

1. A semiconductor device comprising a power semiconductor chip, wherein:
the power semiconductor chip includes:
a substrate,
a semiconductor multilayer arrangement formed on the substrate,
a source electrode and a drain electrode formed on the semiconductor multilayer arrangement with a space between the source electrode and the drain electrode,
a gate electrode formed between the source electrode and the drain electrode, a drain lead trace, a first source lead trace, and a second source lead trace, and a first terminal, a second terminal, a third terminal, and a fourth terminal, and the gate electrode is connected to the first terminal, the drain electrode and the second terminal are connected together through the drain lead trace, the source electrode and the third terminal are connected together through the first source lead trace, the source electrode and the fourth terminal are connected together through the second source lead trace, and the second terminal and the third terminal are configured to cause a main current to flow between the second terminal and the third terminal.

2. The semiconductor device of claim 1, wherein the second source lead trace is formed between the first source lead trace and the drain lead trace.

3. The semiconductor device of claim 1, wherein the drain lead trace, the first source lead trace, and the second source lead trace are each an elongated trace extending in a horizontal or vertical direction.

4. The semiconductor device of claim 1, wherein the trace width of the second source lead trace is smaller than the trace width of the drain lead trace or the first source lead trace.

5. The semiconductor device of claim 1, wherein the second source lead trace is formed in the same layer in which the source electrode is formed.

6. The semiconductor device of claim 1, wherein the second source lead trace is formed on an inactive region.

7. The semiconductor device of claim 1, wherein the gate electrode and the source electrode are each in the shape of a comb.

8. The semiconductor device of claim 1, wherein the second source lead trace and the fourth terminal are connected together by an upper-layer trace.

9. The semiconductor device of claim 1, wherein the semiconductor multilayer arrangement is formed of a nitride semiconductor.

10. The semiconductor device of claim 9, wherein the power semiconductor chip further includes a p-type semiconductor layer formed between the gate electrode and the semiconductor multilayer arrangement.

11. A power conversion device comprising the semiconductor device of claim 1, wherein:

the power semiconductor chip comprises a half-bridge configuration including a high-side switch and a low-side switch, and the high-side switch includes the gate electrode, the source electrode and the drain electrode.

12. The power conversion device of claim 11, wherein:

the power semiconductor chip further includes a drive circuit formed between the first terminal and the gate electrode, and the drive circuit has a ground terminal connected to the fourth terminal.

13. The power conversion device of claim 12, wherein the drive circuit includes any of a MOSFET, a JFET, and an HFET.

* * * * *